(12) United States Patent
Basker et al.

(10) Patent No.: US 9,653,456 B2
(45) Date of Patent: May 16, 2017

(54) MIM CAPACITOR FORMATION IN RMG MODULE

(71) Applicant: INTERNATIONAL BUSINESS MACHINES CORPORATION, Armonk, NY (US)

(72) Inventors: Veeraraghavan S. Basker, Schenectady, NY (US); Kangguo Cheng, Schenectady, NY (US); Theodorus E. Standaert, Clifton Park, NY (US); Junli Wang, Singerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/222,612

(22) Filed: Jul. 28, 2016

(65) Prior Publication Data
US 2017/0040314 A1     Feb. 9, 2017

Related U.S. Application Data

(62) Division of application No. 14/819,122, filed on Aug. 5, 2015, now Pat. No. 9,490,252.

(51) Int. Cl.
*H01L 21/8242* (2006.01)
*H01L 27/06* (2006.01)
(Continued)

(52) U.S. Cl.
CPC .... *H01L 27/0629* (2013.01); *H01L 21/28247* (2013.01); *H01L 28/40* (2013.01); *H01L 28/60* (2013.01); *H01L 29/401* (2013.01)

(58) Field of Classification Search
CPC ............. H01L 27/0629; H01L 27/1082; H01L 27/224; H01L 27/66181; H01L 27/1085; H01L 27/10852; H01L 27/10858
See application file for complete search history.

(56) References Cited

U.S. PATENT DOCUMENTS 7,041,552 B2   5/2006  Clevenger et al.
7,242,056 B2   7/2007  Chaudhry et al.
(Continued)

OTHER PUBLICATIONS

List of IBM Patents or Patent Applications Treated as Related dated Jul. 28, 2016, 2 pages.

*Primary Examiner* — Hoai V Pham
(74) *Attorney, Agent, or Firm* — Tutunjian & Bitetto, P.C.; Vazken Alexanian

(57) ABSTRACT

A method is provided for forming a metal-insulator-metal capacitor in a replacement metal gate module. The method includes providing a gate cap formed on a gate. The method further includes removing a portion of the gate cap and forming a recess in the gate. A remaining portion of the gate forms a first electrode of the capacitor. The method also includes depositing a dielectric on remaining portions of the gate cap and the remaining portion of the gate. The method additionally includes depositing a conductive material on the dielectric. The method further includes removing a portion of the conductive material and portions of the dielectric to expose a remaining portion of the conductive material and a remaining portion of the dielectric. The remaining portion of the conductive material forms a second electrode of the capacitor. The remaining portion of the dielectric forms an insulator of the capacitor.

9 Claims, 8 Drawing Sheets

(51) Int. Cl.
*H01L 49/02* (2006.01)
*H01L 29/40* (2006.01)
*H01L 21/28* (2006.01)

(56) References Cited

U.S. PATENT DOCUMENTS

| | | | |
|---|---|---|---|
| 7,361,950 | B2 | 4/2008 | Chinthakindi et al. |
| 7,750,388 | B2 | 7/2010 | Ho et al. |
| 7,851,861 | B2 | 12/2010 | Tu |
| 8,017,997 | B2 | 9/2011 | Divakaruni et al. |
| 8,368,136 | B2 | 2/2013 | Chuang et al. |
| 8,652,898 | B2 | 2/2014 | Cheng et al. |
| 8,709,890 | B2 | 4/2014 | Cheng et al. |
| 8,748,258 | B2 | 6/2014 | Cheng et al. |
| 2007/0057343 | A1* | 3/2007 | Chinthakindi .......... H01L 28/40 257/532 |

* cited by examiner

MIM CAPACITOR FORMATION IN RMG MODULE

BACKGROUND

Technical Field

The present invention relates generally to microelectronics circuits and, in particular, to metal-insulator-metal (MIM) capacitor formation in a replacement metal gate (RMG) module.

Description of the Related Art

The Metal-Insulator-Metal capacitor is a key passive component in Radio Frequency (RF) and analog integrated circuits. MIM capacitors have attracted great attention because of their high capacitance density that supplies small area, increases circuit density, and further reduces the fabrication cost. MIM capacitors provide good voltage linearity properties.

SUMMARY

According to an aspect of the present principles, a method is provided for forming a metal-insulator-metal capacitor in a replacement metal gate module. The method includes providing a gate cap formed on a gate. The method further includes removing a portion of the gate cap and forming a recess in the gate. A remaining portion of the gate forms a first electrode of the capacitor. The method also includes depositing a dielectric on remaining portions of the gate cap and the remaining portion of the gate. The method additionally includes depositing a conductive material on the dielectric. The method further includes removing a portion of the conductive material and portions of the dielectric to expose a remaining portion of the conductive material and a remaining portion of the dielectric. The remaining portion of the conductive material forms a second electrode of the capacitor. The remaining portion of the dielectric forms an insulator of the capacitor.

According to another aspect of the present principles, a method is provided for forming a metal-insulator-metal capacitor in a replacement metal gate module. The method includes providing a gate cap formed on a gate. The method further includes forming a plurality of recesses by forming a plurality of voids in the gate cap and forming a plurality of gate recesses in the gate under the plurality of voids. A remaining portion of the gate forms a first electrode of the capacitor. The method also includes depositing a dielectric on remaining portions of the gate cap and the remaining portion of the gate. The method additionally includes depositing a conductive material on the dielectric. The method further includes removing a plurality of portions of the dielectric and a remaining portion of the conductive material to expose a plurality of remaining portions of the dielectric and a plurality of remaining portions of the conductive material. The plurality of remaining portions of the dielectric form at least a portion of an insulator of the capacitor. The plurality of remaining portions of the conductive material form a second electrode of the capacitor.

According to yet another aspect of the present principles, a metal-insulator-metal capacitor is provided in a replacement metal gate module having a gate cap formed on a gate. The capacitor includes a first electrode formed within a portion of the gate using a metal forming the gate. The first electrode has a horizontal component and a stack rising from at least a portion of the horizontal component. The capacitor further includes an insulator formed within a recess. The recess is formed to have a lower portion and walls rising from edges of the lower portion. The lower portion is formed on a different portion of the horizontal component than the stack. The walls are formed adjacent to a sidewall of the stack and a portion of the gate cap. The capacitor also includes a second electrode formed within the recess and on the insulator.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

The present principles are directed to metal-insulator-metal (MIM) capacitor formation in a replacement metal gate (RMG) module.

Figure 1:
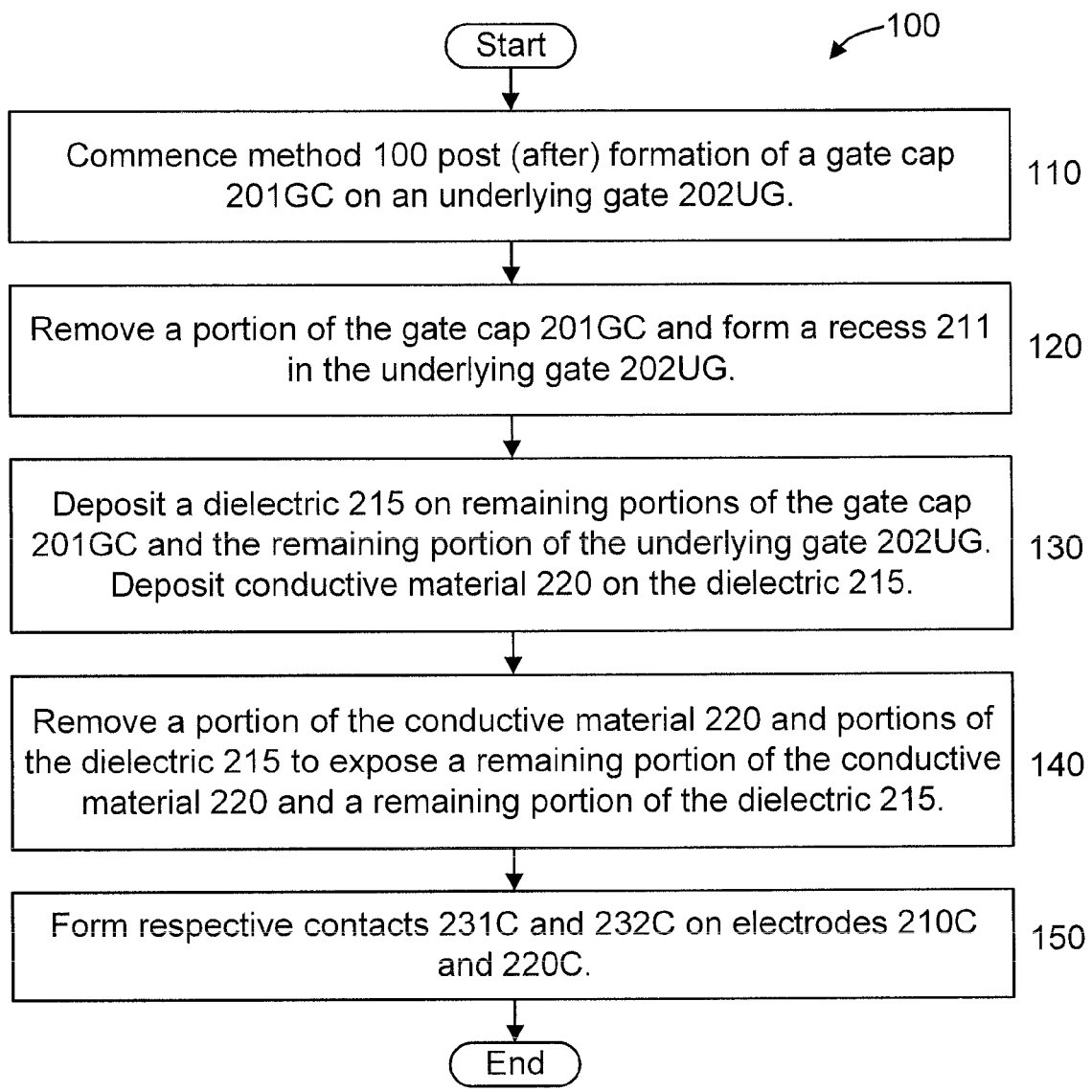
FIG. 1 shows an exemplary method 100 for metal-insulator-metal capacitor formation in a replacement metal gate (RMG) module, in accordance with an embodiment of the present principles.
Figure 3:
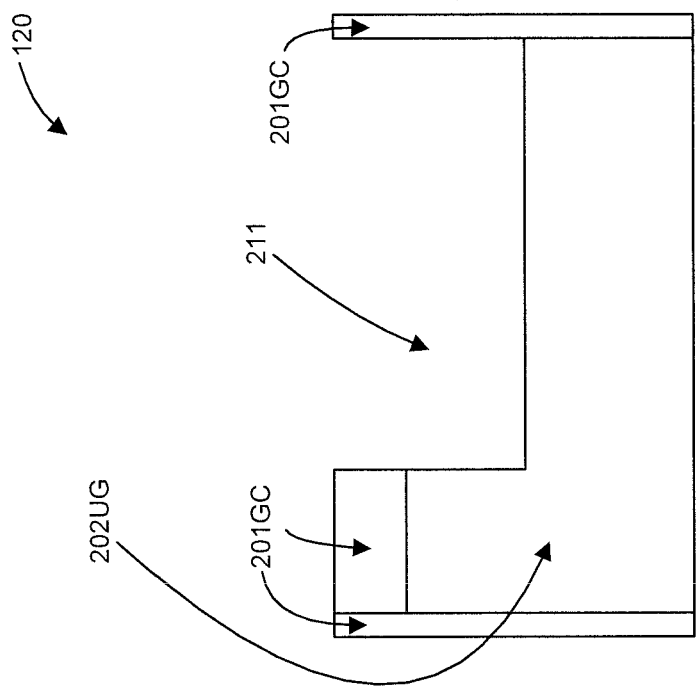
FIG. 3 shows a cross-sectional view of a metal-insulator-metal capacitor at step 120 of method 100, according to an embodiment of the present principles.
Figure 2:
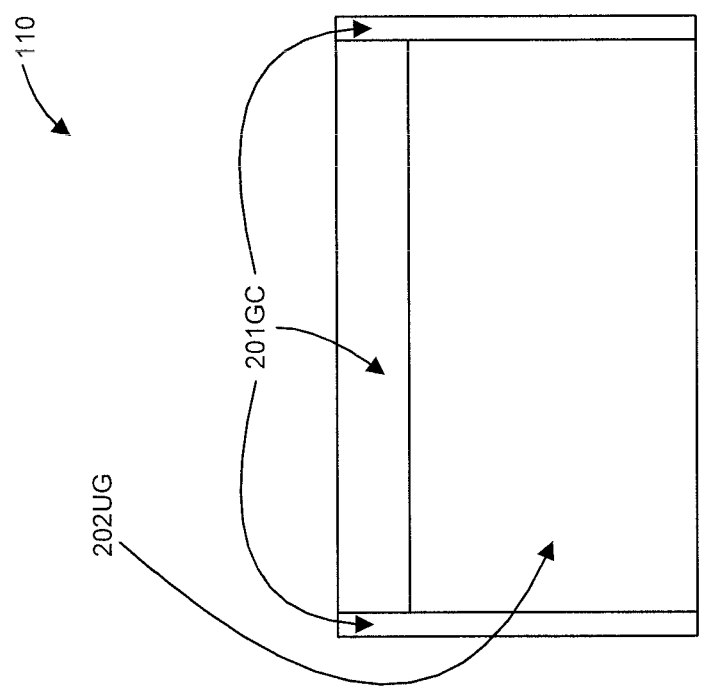
FIG. 2 shows a cross-sectional view of a metal-insulator-metal capacitor at step 110 of method 100, according to an embodiment of the present principles.
Figure 4:
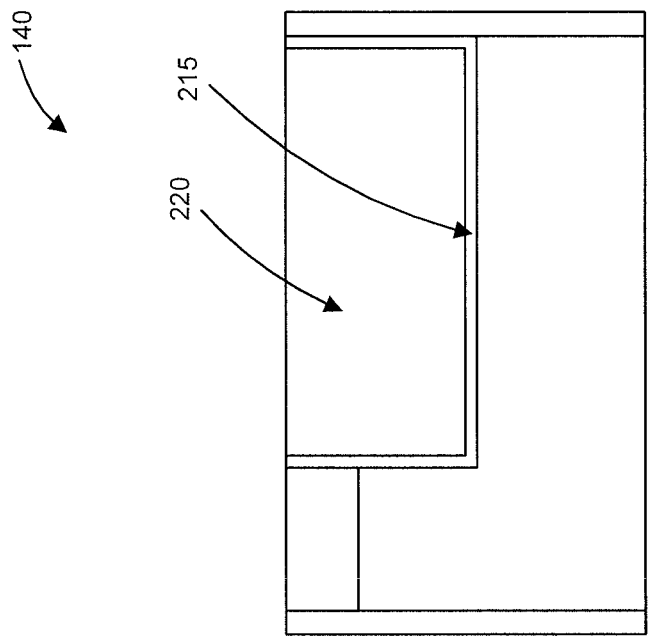
FIG. 4 shows a cross-sectional view of a metal-insulator-metal capacitor at step 130 of method 100, according to an embodiment of the present principles.
Figure 5:
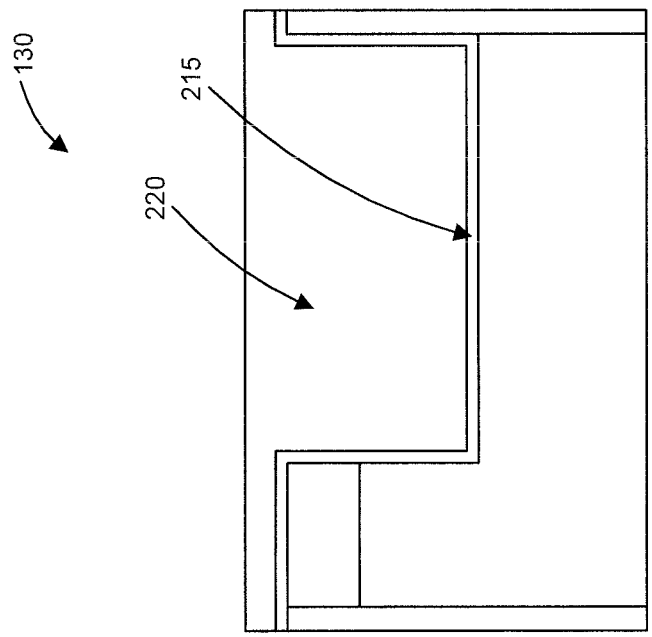
FIG. 5 shows a cross-sectional view of a metal-insulator-metal capacitor at step 140 of method 100, according to an embodiment of the present principles.
Figure 6:
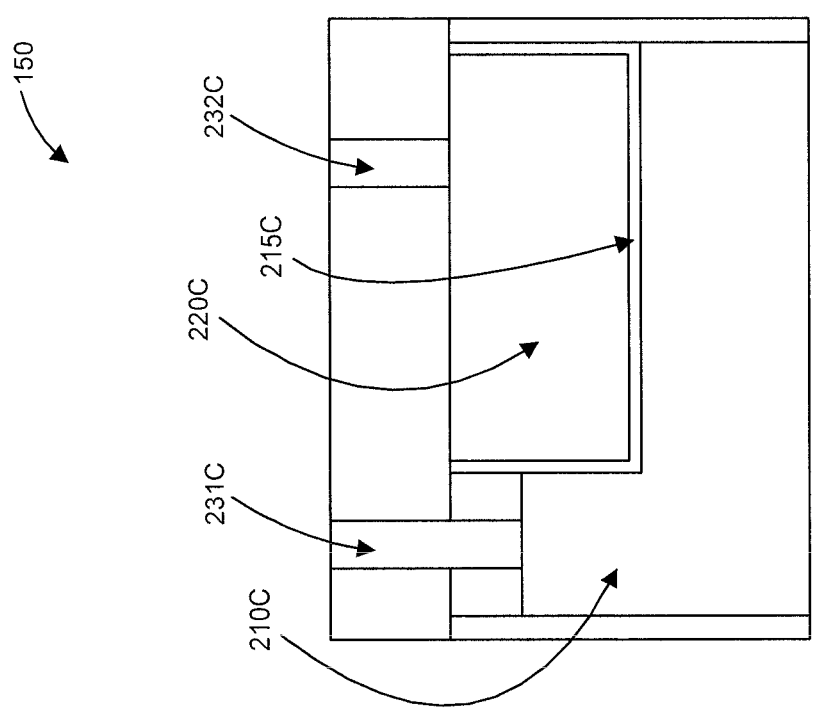
FIG. 6 shows a cross-sectional view of a metal-insulator-metal capacitor at step 150 of method 100, according to an embodiment of the present principles.

FIG. 1 shows an exemplary method 100 for metal-insulator-metal capacitor formation in a replacement metal gate (RMG) module, in accordance with an embodiment of the present principles. FIGS. 2-6 show various cross-sectional views of a metal-insulator-metal capacitor at various steps in method 100, according to an embodiment of the present principles. At least the following correlations apply: step 110 (FIG. 2); step 120 (FIG. 3); step 130 (FIG. 4); step 140 (FIG. 5); and step 150 (FIG. 6).

At step 110 (FIG. 2), commence method 100 post (after) formation of a gate cap 201GC on an underlying gate 202UG.

In an embodiment, the underlying gate 202UG is formed from a metal (hereinafter "gate metal"), and thus both (the underlying gate and the gate metal) are interchangeably referred to herein by the reference characters 202UG. In an embodiment, the gate metal 202UG is Tungsten (W). Of course, other materials can be used for the gate metal 202UG, while maintaining the spirit of the present principles.

In an embodiment, the gate cap 201GC is formed using a dielectric (hereinafter "gate cap dielectric"). In an embodiment, the gate cap dielectric is a high K dielectric. Of course, other types of dielectrics can be used, while maintaining the spirit of the present principles.

At step 120 (FIG. 3), remove a portion of the gate cap 201GC and form a recess 211 in the underlying gate 202UG. The remaining portion of the underlying gate 202UG forms a first electrode 210C of MIM capacitor 200 as shown in FIG. 6.

At step 130 (FIG. 4), deposit a dielectric 215 on remaining portions of the gate cap 201GC and the remaining portion of the underlying gate 202UG. Deposit conductive material 220 on the dielectric 215.

In an embodiment, the dielectric 215 is a high K dielectric. Of course, other types of dielectrics can be used, while maintaining the spirit of the present principles.

In an embodiment, the conductive material 220 is Titanium nitride/Tungsten (TiN/W). Of course, other conductive materials can be used, while maintaining the spirit of the present principles.

At step 140 (FIG. 5), remove a portion of the conductive material 220 and portions of the dielectric 215 to expose a remaining portion of the conductive material 220 and a remaining portion of the dielectric 215. The remaining portion of the conductive material 220 forms a second electrode 220C of MIM capacitor 200 as shown in FIG. 6. The remaining portion of the dielectric 215 forms an insulator 215C of MIM capacitor 200 as shown in FIG. 6.

In an embodiment, such as that shown in FIG. 1, step 140 involves removing selected (topmost) horizontal components of the dielectric 215 deposited at step 130 so only the vertical components (walls) and an unselected (bottommost) horizontal component of the dielectric 215 remain.

In an embodiment, step 140 involves polishing, patterning, etching, and/or any other technique to remove portions from materials 215 and 220.

At step 150 (FIG. 6), form respective contacts 231C and 232C on electrodes 210C and 220C thus forming MIM capacitor 200.

It is to be appreciated that each of the preceding layers/elements shown in FIGS. 2-6 can be formed or printed optically through well-known photolithographic masking, developing and level definition, e.g., depositing, implanting, patterning, etching, polishing, and so forth. Thus, the present principles are not limited to any particular process for forming the layers/elements shown in FIGS. 2-6.

It is to be further appreciated that the gate cap can be formed from the same dielectric material or a different dielectric material than that deposited at step 130. Moreover, while a high K dielectric is described as being deposited at step 130, a non-high K dielectric can also be used in place thereof while maintaining the spirit of the present principles.

Figure 7:
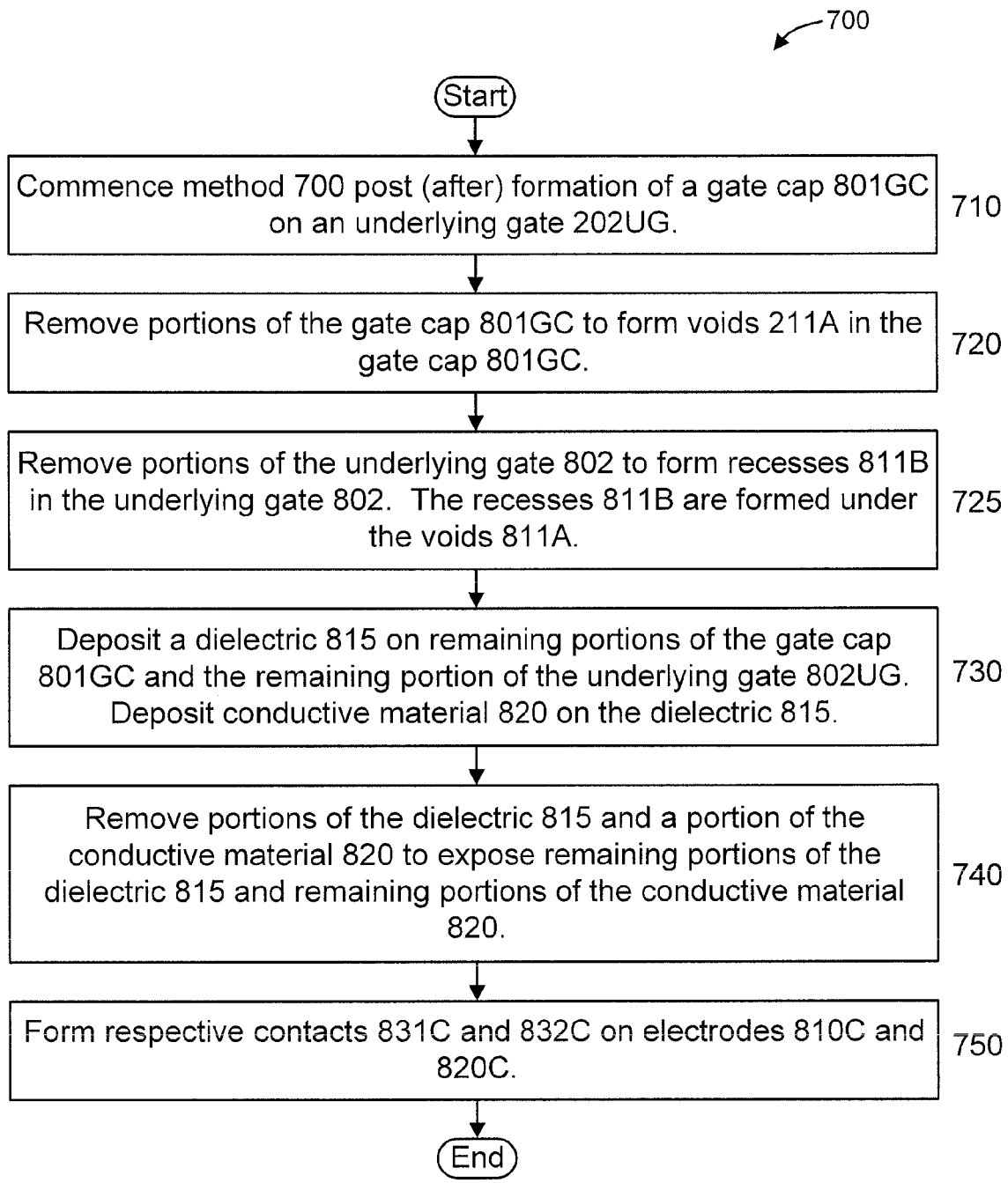
FIG. 7 shows another exemplary method 700 for metal-insulator-metal capacitor formation in a replacement metal gate (RMG) module, in accordance with an embodiment of the present principles.
Figure 9:
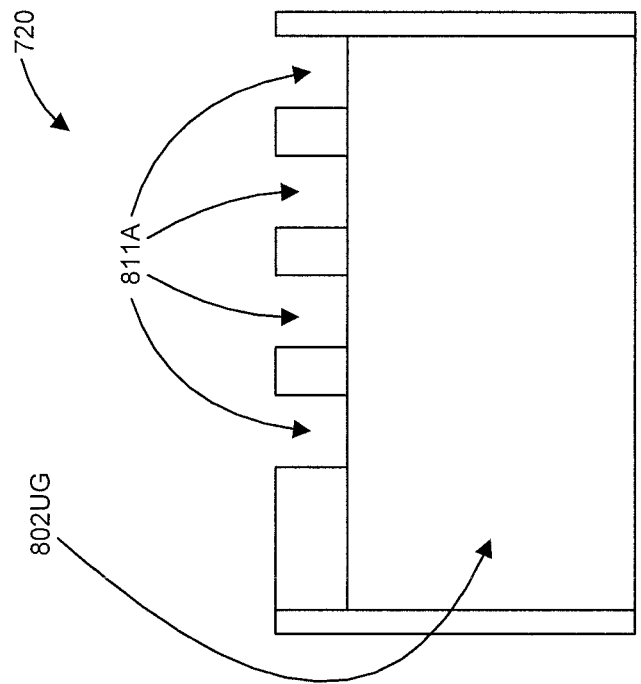
FIG. 9 shows a cross-sectional view of a metal-insulator-metal capacitor at step 720 of method 700, according to an embodiment of the present principles.
Figure 8:
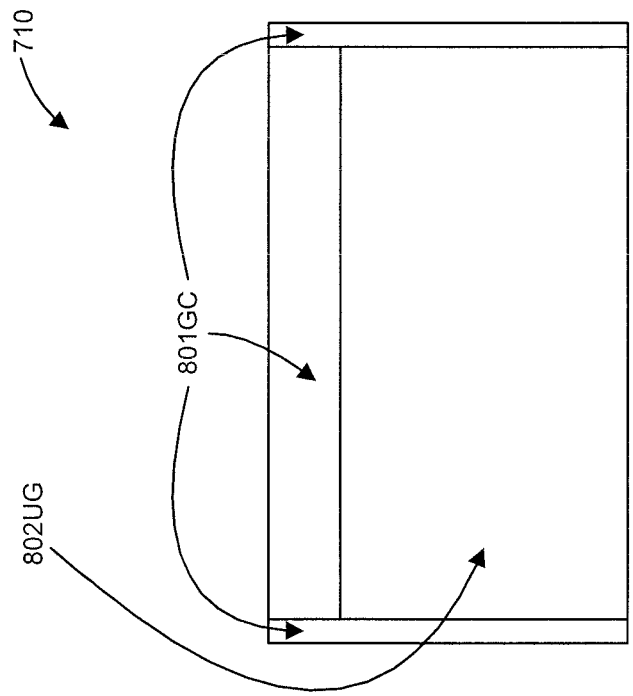
FIG. 8 shows a cross-sectional view of a metal-insulator-metal capacitor at step 710 of method 700, according to an embodiment of the present principles.
Figure 11:
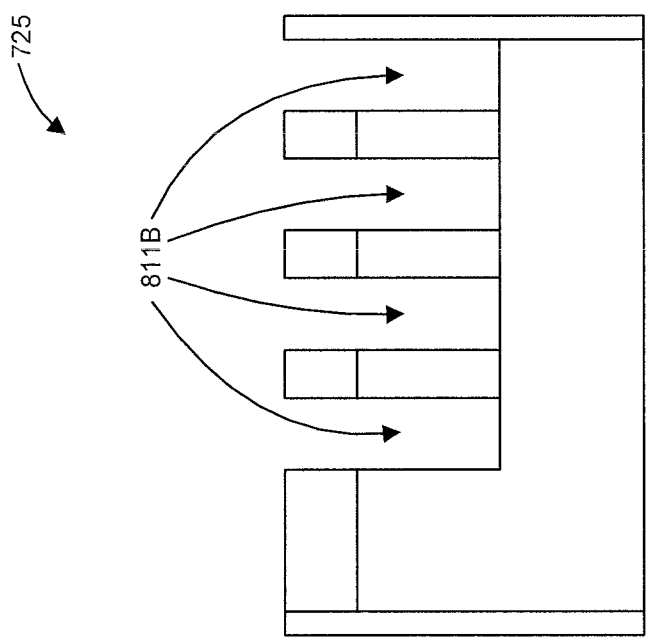
FIG. 11 shows a cross-sectional view of a metal-insulator-metal capacitor at step 730 of method 700, according to an embodiment of the present principles.
Figure 10:
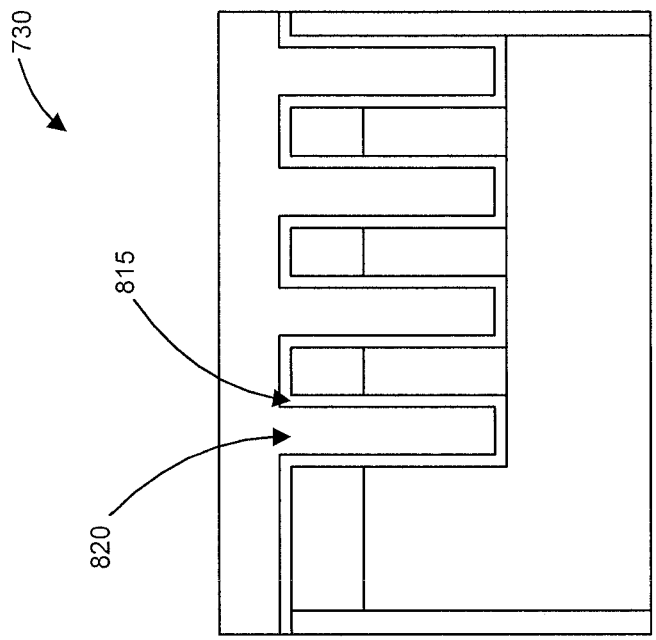
FIG. 10 shows a cross-sectional view of a metal-insulator-metal capacitor at step 725 of method 700, according to an embodiment of the present principles.
Figure 13:
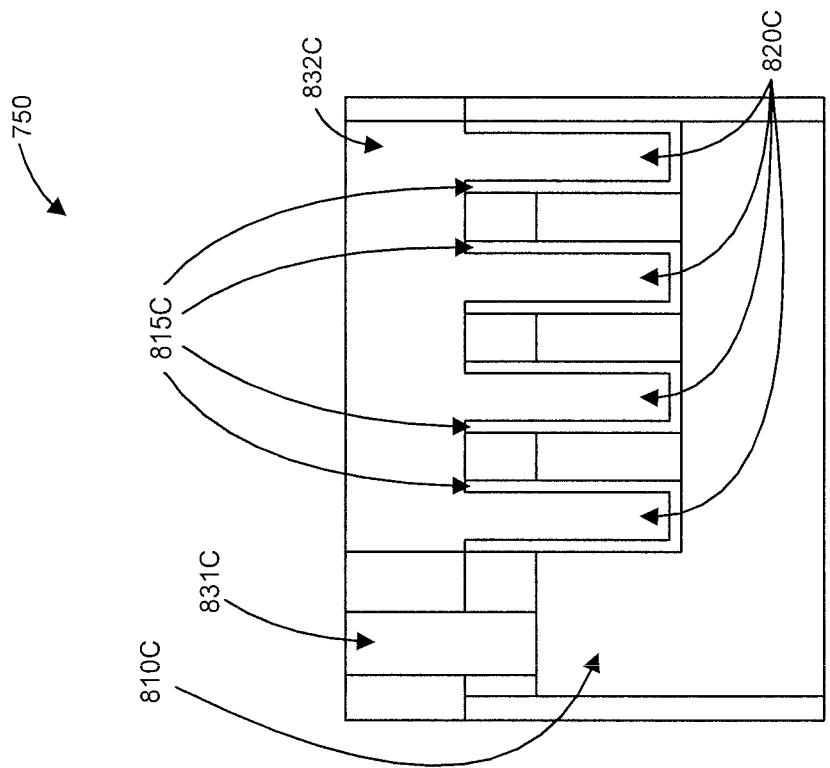
FIG. 13 shows a cross-sectional view of a metal-insulator-metal capacitor at step 750 of method 700, according to an embodiment of the present principles.
Figure 12:
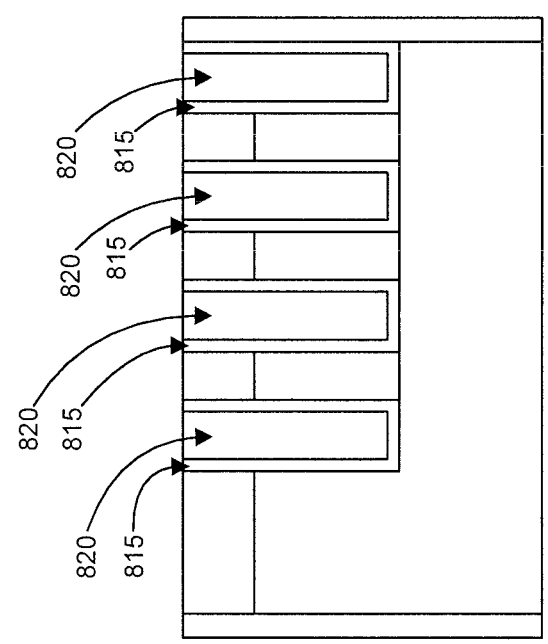
FIG. 12 shows a cross-sectional view of a metal-insulator-metal capacitor at step 740 of method 700, according to an embodiment of the present principles.

FIG. 7 shows another exemplary method 700 for metal-insulator-metal capacitor formation in a replacement metal gate (RMG) module, in accordance with an embodiment of the present principles. FIGS. 8-13 show various cross-sectional views of a metal-insulator-metal capacitor at various steps in method 700, according to an embodiment of the present principles. At least the following correlations apply: step 710 (FIG. 8); step 720 (FIG. 9); step 725 (FIG. 10); step 730 (FIG. 11); step 740 (FIG. 12); and step 750 (FIG. 13).

At step 710 (FIG. 8), commence method 700 post (after) formation of a gate cap 801GC on an underlying gate 202UG.

In an embodiment, the underlying gate 802UG is formed from a metal (hereinafter "gate metal"), and thus both (the underlying gate and the gate metal) are interchangeably referred to herein by the reference characters 802UG. In an embodiment, the gate metal 802UG is Tungsten (W). Of course, other materials can be used for the gate metal 802UG, while maintaining the spirit of the present principles.

In an embodiment, the gate cap 801GC is formed using a dielectric (hereinafter "gate cap dielectric"). In an embodiment, the gate cap dielectric is a high K dielectric. Of course, other types of dielectrics can be used, while maintaining the spirit of the present principles.

At step 720 (FIG. 9), remove portions of the gate cap 801GC to form voids 211A in the gate cap 801GC.

At step 725 (FIG. 10), remove portions of the underlying gate 802 to form recesses 811B in the underlying gate 802. The recesses 811B are formed under the voids 811A. The remaining portions of the underlying gate 802UG form a first electrode 810C of MIM capacitor 800 as shown in FIG. 13.

At step 730 (FIG. 11), deposit a dielectric 815 on remaining portions of the gate cap 801GC and the remaining portion of the underlying gate 802UG. Deposit conductive material 820 on the dielectric 815.

In an embodiment, the dielectric 815 is a high K dielectric. Of course, other types of dielectrics can be used, while maintaining the spirit of the present principles.

In an embodiment, the conductive material 820 is Titanium nitride/Tungsten (TiN/W). Of course, other conductive materials can be used, while maintaining the spirit of the present principles.

At step 740 (FIG. 12), remove portions of the dielectric 815 and a portion of the conductive material 820 to expose remaining portions of the dielectric 815 and remaining portions of the conductive material 820. The remaining portions of the dielectric 815 form at least part of an insulator 815C of MIM capacitor 800 as shown in FIG. 13. At least some of the remaining portions of the gate cap 801GC also form insulator 815C as shown in FIG. 13. The remaining portions of the conductive material 820 form a second electrode 820C of MIM capacitor 800 as shown in FIG. 13.

In an embodiment, such as that shown in FIG. 7, step 740 involves removing selected (topmost) horizontal components of the high K dielectric 815 deposited at step 730 so only the vertical components (walls) and unselected (bottommost) horizontal components of the dielectric 815 remain.

In an embodiment, step 740 involves polishing, patterning, etching, and/or any other technique to remove portions from materials 815 and 820.

At step 750 (FIG. 13), form respective contacts 831C and 832C on electrodes 810C and 820C thus forming MIM capacitor 800.

As is evident to one of ordinary skill in the art, the structure of MIM capacitor 800 has an increased area compared to MIM capacitor 200.

It is to be appreciated that each of the preceding layers/elements shown in FIGS. 8-13 can be formed or printed optically through well-known photolithographic masking, developing and level definition, e.g., depositing, implanting, patterning, etching, polishing, and so forth. Thus, the present principles are not limited to any particular process for forming the layers/elements shown in FIGS. 8-13.

It is to be further appreciated that the gate cap can be formed from the same dielectric material or a different dielectric material than that deposited at step 130. Moreover, while a high K dielectric is described as being deposited at step 130, a non-high K dielectric can also be used in place thereof while maintaining the spirit of the present principles.

It is to be additionally appreciated that the present principles form a MIM capacitor within a gate(s) of another device(s) (and, thus, can also be formed on a region of the other device(s) without any semiconductor material present), as well as use the gate metal of the other device(s) as one of the electrodes, thereby simplifying the flow in contrast to prior art approaches such as those that use source/drain (S/D) and gate regions to form capacitors.

We note that as compared to prior art which forms capacitors in a more classical fashion (layer-by-layer in a separate region), the present principles use the gate material as one of the stacks as well as form the capacitor in the gate region(s), resulting in a simpler flow.

We further note that the present principles do not suffer from limitations such as the capacitor insulator thickness being determined by contact etch (therefore making such thickness essentially variable). Rather, the present principles form a capacitor structure within the gate(s) by recessing the metal (which is used as the first electrode), then depositing the capacitor insulator (which, hence, is very controlled), followed by the second electrode deposition.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a metal-insulator-metal capacitor in a replacement metal gate module, comprising:
providing a gate cap formed on a gate;
forming a plurality of recesses by forming a plurality of voids in the gate cap and forming a plurality of gate recesses in the gate under the plurality of voids, a remaining portion of the gate forming a first electrode of the capacitor;
depositing a dielectric on remaining portions of the gate cap and the remaining portion of the gate;
depositing a conductive material on the dielectric; and
removing a plurality of portions of the dielectric and a remaining portion of the conductive material to expose a plurality of remaining portions of the dielectric and a plurality of remaining portions of the conductive material, the plurality of remaining portions of the dielectric forming at least a portion of an insulator of the capacitor and the plurality of remaining portions of the conductive material forming a second electrode of the capacitor.

2. The method of claim 1, further comprising forming respective contacts on the first and second electrodes.

3. The method of claim 1, wherein removing the plurality of portions of the dielectric exposes at least some remaining portions of the gate cap, the at least some remaining portions of the gate cap also forming the insulator of the capacitor.

4. The method of claim 1, wherein depositing the conductive material on the dielectric comprises filling portions of the plurality of recesses with the conductive material.

5. The method of claim 1, wherein at least a portion of the capacitor is formed within a gate of a field effects transistor.

6. The method of claim 1, wherein at least a portion of the capacitor is formed on a region of a field effects transistor, the region being without any semiconductor present.

7. The method of claim 1, wherein said forming step uses a gate metal of the field effect transistor as the first electrode of the capacitor.

8. The method of claim 1, wherein the gate cap is a high K dielectric.

9. The method of claim 1, wherein the conductive material is titanium nitride/tungsten.

* * * * *